US010229883B2

(12) United States Patent
Srinivasan et al.

(10) Patent No.: US 10,229,883 B2
(45) Date of Patent: Mar. 12, 2019

(54) SYSTEMS, METHODS, AND APPARATUSES FOR IMPLEMENTING LATE FUSING OF PROCESSOR FEATURES USING A NON-VOLATILE MEMORY

(71) Applicant: Intel Corporation, Santa Clara, CA (US)

(72) Inventors: Vasudevan Srinivasan, Hillsboro, OR (US); Daniel G. Borkowski, Lunenburg, MA (US)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 15/283,364

(22) Filed: Oct. 1, 2016

(65) Prior Publication Data

US 2018/0096177 A1    Apr. 5, 2018

(51) Int. Cl.
*H01L 23/538* (2006.01)
*G06F 12/02* (2006.01)
(Continued)

(52) U.S. Cl.
CPC ............ *H01L 23/5385* (2013.01); *G06F 1/26* (2013.01); *G06F 12/0246* (2013.01);
(Continued)

(58) Field of Classification Search
CPC ............ H01L 23/5385; H01L 23/5384; H01L 23/5386; H01L 23/5389; H01L 25/18; G06F 1/26; G06F 12/0246
See application file for complete search history.

(56) References Cited

U.S. PATENT DOCUMENTS 8,502,676 B2    8/2013  Camarota
8,720,788 B1 *  5/2014  Mizzo ............... G06K 19/07728
                                                    235/375
(Continued)

FOREIGN PATENT DOCUMENTS

WO    WO 2014035541    3/2014

OTHER PUBLICATIONS

International Search Report & Written Opinion for PCT/US2017/049224, dated Dec. 12, 2017, 11 pages.

*Primary Examiner* — Brian A Zimmerman
*Assistant Examiner* — Kevin Lau
(74) *Attorney, Agent, or Firm* — Schwabe, Williamson & Wyatt, P.C.

(57) ABSTRACT

In accordance with disclosed embodiments, there are provided systems, methods, and apparatuses for implementing late fusing of processor features using a non-volatile memory. For instance, there is disclosed in accordance with one embodiment a functional semiconductor package, including: a processor core configurable via a plurality of configuration registers; a non-volatile storage, in which a first portion of the non-volatile storage includes permanently lockable storage that once written cannot be overwritten or modified, and in which a second portion of the non-volatile storage includes the plurality of configuration registers; a first write interface to the non-volatile storage, in which the permanently lockable storage of the non-volatile storage is wirelessly writable externally from the functional semiconductor package via the first write interface; a second write interface to the non-volatile storage through which the plurality of configuration registers are writable; configuration data for the processor core written wirelessly into the permanently lockable storage of the non-volatile storage; and in which the configuration data is distributed into the plurality of configuration registers via the second write
(Continued)

interface at every boot of the functional semiconductor package. Other related embodiments are disclosed.

25 Claims, 8 Drawing Sheets

(51) Int. Cl.
G06F 1/26 (2006.01)
H01L 25/18 (2006.01)

(52) U.S. Cl.
CPC ...... *H01L 23/5384* (2013.01); *H01L 23/5386* (2013.01); *H01L 23/5389* (2013.01); *H01L 25/18* (2013.01)

(56) References Cited

U.S. PATENT DOCUMENTS

| | | |
|---|---|---|
| 9,053,025 B2 | 6/2015 | Ben-Kiki et al. |
| 9,378,787 B2 | 6/2016 | Perego et al. |
| 2016/0055103 A1* | 2/2016 | Albini ................ G06F 13/4036 711/163 |
| 2016/0267717 A1 | 9/2016 | Bar-Zeev et al. |

* cited by examiner

SYSTEMS, METHODS, AND APPARATUSES FOR IMPLEMENTING LATE FUSING OF PROCESSOR FEATURES USING A NON-VOLATILE MEMORY

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to systems, methods, and apparatuses for systems, methods, and apparatuses for implementing late fusing of processor features using a non-volatile memory.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

Modern microprocessors have various features engineered and implemented through their specific process of fabrication and manufacture attributable to the particular tape-out for that product. In electronics design, tape-out (also known as pattern generation) is the final result of the design process for integrated circuits before they are sent for manufacture. The tape-out is specifically the point at which the photomask of the circuit is sent to the fabrication facility.

As will be appreciated, not all features are always enabled on all units for any given base microprocessor tape-out. Each microprocessor is configured to match a particular product specification and feature set by having various features enabled and/or disabled based on physical tested characteristics, marketing requirements, price point, customer requested configuration, and so forth.

The resulting manufactured microprocessors having their various features enabled and/or disabled are then tracked for inventory purposes against a particular part number or configuration via a "SKU" or Stock Keeping Unit.

Today's industry and marketplace necessitates multiple such SKUs to be defined and tracked to satisfy customer demands and the manufacturer's business objectives.

Unfortunately, producing and tracking the multiple such product SKUs requires significant costs and overhead expenditures.

The present state of the art may therefore benefit from the means for implementing late fusing of processor features using a non-volatile memory as described herein.

BRIEF DESCRIPTION OF THE DRAWINGS

Embodiments are illustrated by way of example, and not by way of limitation, and will be more fully understood with reference to the following detailed description when considered in connection with the figures in which.

DETAILED DESCRIPTION

Figure 1:
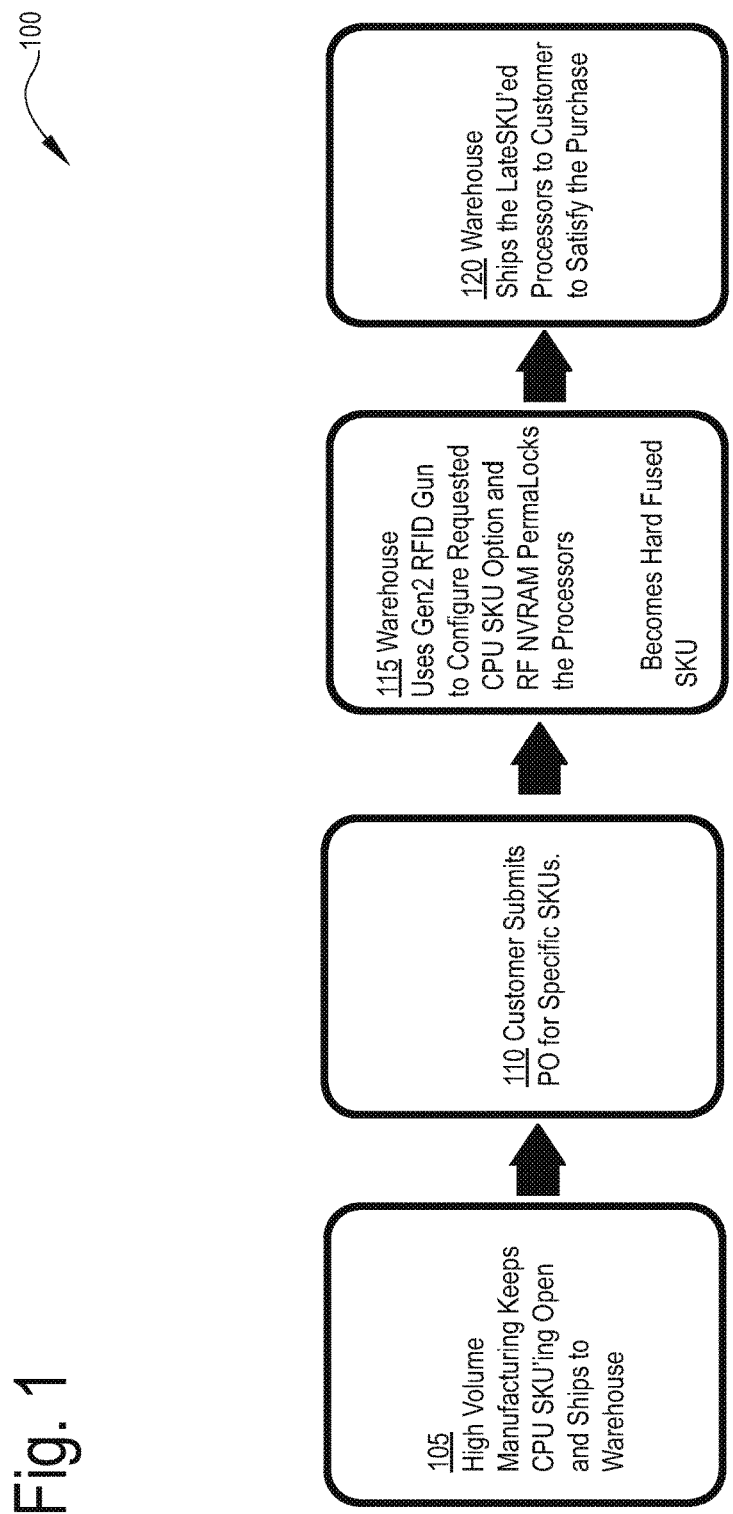
FIG. 1 depicts an exemplary manufacturing process flow for late SKU fusing utilizing RF NVRAM in accordance with which embodiments may operate.

Described herein are systems, methods, and apparatuses for implementing late fusing of processor features using a non-volatile memory. For instance, according to one embodiment a functional semiconductor package, including: a processor core configurable via a plurality of configuration registers; a non-volatile storage, in which a first portion of the non-volatile storage includes permanently lockable storage that once written cannot be overwritten or modified, and in which a second portion of the non-volatile storage includes the plurality of configuration registers; a first write interface to the non-volatile storage, in which the permanently lockable storage of the non-volatile storage is wirelessly writable externally from the functional semiconductor package via the first write interface; a second write interface to the non-volatile storage through which the plurality of configuration registers are writable; configuration data for the processor core written wirelessly into the permanently lockable storage of the non-volatile storage; and in which the configuration data is distributed into the plurality of configuration registers via the second write interface at every boot of the functional semiconductor package.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 depicts an exemplary manufacturing process flow 100 for late SKU fusing utilizing RF NVRAM in accordance with which embodiments may operate.

In particular, there is depicted starting from the left at block 105, processing for High Volume Manufacturing (HVM) which keeps a fabricated CPU's SKU open and ships that open SKU'd CPU to a warehouse or other distribution point subsequent to the manufacturing facility where the CPU is fabricated. The open SKU'd device need not be a CPU die, but may be any semiconductor device, such as a logic die, a functional silicon die, a System On a Chip functional silicon die, a stacked semiconductor package, a3D semiconductor package, a 2LM semiconductor package, etc.

At block 110, it is depicted that a customer submits a PO (Purchase Order) for specific SKUs, for instance, a retailer or a wholesaler may request 10,000 Intel i7 XYZ cores and 5,000 Intel i7 ABC cores, etc. Assuming both may be yielded from the same base Intel i7 processor having an open SKU (e.g., not yet permanently fused or configured to a specific SKU or part number), then it is possible to produce all 15,000 from the same base Intel i7 processor core stock. Conversely, had the two disparate SKUs been fused at the time of manufacture, as is done with conventional processing, then it would be necessary to pull the 10,000 units from appropriate stock, meaning that the stock must be held at great financial cost and overhead burdens and the 5,000 must also be pulled from the appropriate stock, again at great financial cost and overhead burdens.

With the conventional approach where each SKU is stocked, there are essentially two possibilities. One outcome is that the stock is available, which by definition means that an overage or an excess of what is actually required is held in anticipation of future demand. If the demand does not materialize then the stock is wasted or scrapped. Alternatively, if the stock is not available, that is to say they are "back ordered," then the units must be manufactured, leading to excessive delay, and quite possibly causing the customer to not purchase or forgo the purchase of the back ordered stock.

The more SKUs exist, the more financially burdensome and complicated it becomes to track and anticipate the appropriate demand levels.

However, if the base CPUs may be shipped from the point of manufacture to the distribution points and a "late fuse" process is performed to configure the base units to specific part numbers corresponding to a particular SKU, then it is significantly less complicated to stock the necessary volume of base units as they may subsequently be configured to any desired SKU derivable from such a base. There may, of course, be multiple such base CPUs or semiconductor devices, whatever the type.

At block 115, it is then depicted that, according to this particular embodiment, the warehouse uses a Gen2 (e.g., second generation) RFID gun to configure the requested CPU SKU option and RF NVRAM is utilized to permanently lock or "PermaLock" the now configured and CPU SKU'd processor. Stated differently, the CPU processor becomes a hard fused SKU which cannot from then forward be re-worked or re-configured into any other part or SKU.

Certain definitions may be helpful in view of the foregoing description. For instance, RFID is a Radio-Frequency IDentification (RFID) device which utilizes electromagnetic fields to automatically identify and track tags attached to or embedded within a wide array of objects. Such tags contain electronically stored information. Passive RFID tags collect energy from a nearby RFID device's (a gun for programming or a reader for reading) interrogating radio waves to energize, receive, and store, or to energize, retrieve, and respond with their stored information, such as a unique identification string. Conversely, active RFID tags have with them a local power source such as a battery and may operate at hundreds of meters from the RFID reader. Unlike a barcode, the tag need not be within the line of sight of the reader, so it may be embedded in the tracked object, even completely hidden from view or manufactured into the interior portions of a part, including within a functional semiconductor device such as a CPU die, SOC die, logic die, memory die, etc. Such RFID technologies are very often utilized for so called Automatic Identification and Data Capture (AIDC).

AGen2 RFID gun is simply an RFID programmer or writer capable of communicating with the embedded RFID tag in a protocol compliant manner to write the desired bit map or fuse register values into the NVRAM of the RFID chip.

The term NVRAM is in reference to Non-Volatile Random-Access Memory or "NVRAM" which is a form of random-access memory that critically, retains its information when power is removed, such as when an electronics device is powered off, thus being non-volatile. Non-volatile memory is therefore in contrast to Dynamic Random-Access Memory or DRAM and Static Random-Access Memory or SRAM, as well as other variants of memory which only maintain data so as long as power is continuously provided. A loss of power results in a loss of data from such volatile memories.

So called PermaLock is a feature of certain Gen 2 RFID Tags providing for at least a portion or a subset of lockable or locking memory. This is distinct from password protected memory portions of RFID tags as there is purposefully no "un-lock" mechanism which permits the memory area to be re-written. It is therefore a form of write-once memory. There are also RFID products available with memory portions that are Perma-Unlock meaning that they can never be locked and others with secured memory which can be password protected, such that it may only be read with appropriate credentials. The PermaLock memory is not an issue of security as it is desired for the configuration of the configured CPU product to be known. Rather, it is imperative that the CPU product cannot be altered once SKU'd or configured to a particular part number, hence it's permanence of the configuration or its being "hard fused," meaning that it cannot be undone, as if the SKU'd configuration was fixed in hardware.

Therefore, coming from block 105 where the CPU or other functional silicon device is manufactured but kept open as a non-SKU'd base CPU which is shipped to a warehouse to the submission and receipt of a customer's PO at block 110, to the programming or SKU'ing of the open SKU CPU at block 115 based on the customer's purchase order, it is thus possible to stock a simple supply of base CPUs without knowing what customers will order, and then once it is ultimately known what the customer's purchase order is, the appropriately SKU'd and configured CPU models may be processed such that at block 120 the warehouse ships the "Late SKU'ed" CPU processors to the customer to satisfy the purchase.

The late SKU'ing process is a very fast process and does not require a significant technical infrastructure which is in stark contrast to the process of fabrication and manufacturing of functional silicon dies and other semiconductor products such as the CPU processor which requires multibillion dollar "FAB" or fabrication buildings and state of the art clean rooms and represent massive capital investment for the manufacturer.

In such a way, it is therefore feasible to stock at a warehouse base model CPUs which are open SKU'd and the subsequently configure those open SKU CPUs to specific configurations pursuant to customer demand.

The various SKU's derived from the single open SKU'd base CPU processor is possible through a technique called "Fusing" in which transistor fuses embedded in the silicon die from which the CPU processor or other semiconductor devices are formed are permanently configured in hardware during high volume manufacturing. As such, marketing and business units must define and provide the list of SKUs that need to be manufactured well in advance so that the manufacturing facilities can accommodate the production of needed product, producing stock for each of the many SKUs.

Once manufactured, the CPU processors having been configured to their respective SKUs are permanently configured and therefore cause inventory build-up issues if not properly planned. Consequently, typical maintenance of such SKUs in manufacturing and warehousing for CPU processor manufacturers costs millions of dollars per year.

Consider for example a CPU processor line up consists of many different SKUs each branded differently, each having differing price points and specifications, features, characteristics, and target markets. Maintaining these SKUs in inventory and tracking them from manufacture all the way to an end-customer costs millions of dollars in what is essentially overhead.

Therefore, it is in accordance with described embodiments that fusing of CPU processors is shifted from utilizing traditional transistor fuses in silicon to using RF NVRAM based storage which is integrated into the microprocessor package. Such a shift allows for maintaining a very limited number of physical SKUs based on the physical test characteristics of the die and moving the marketing based fuse requirements to a "late fuse" process, permitting the CPU processors to be fused (e.g., configured to a specific SKU) nearer to the end of the supply chain to satisfy marketing defined SKU needs and ultimately saving the CPU processor manufacturer millions of dollars by minimizing the costs associated with maintaining an ever increasing number of physical SKUs in factories and throughout the supply chain.

By SKU'ing/Fusing CPU processors using the described late SKU'ing methodologies, rather than SKU'ing the processors at the factory, many other benefits besides costs savings are additionally realized.

As noted above, prior solutions relied upon so called hard SKU'ing in which silicon fuses within the CPU processor are burnt (permanently setting their value) to configure or SKU any given microprocessor die. Such a process works well to track SKUs as once the processor is manufactured, the SKU'd part having been permanently configured through the hard SKU'ing process simply cannot be modified. From a business perspective, hard SKU'ing means that the SKU'd CPU processors may be sold with a deterministic behavior at a deterministic price point.

Another prior method utilizes so called soft SKU'ing which is differentiated from the described embodiments as the resulting configuration or SKU is not permanently configured to the CPU processor itself, but rather, exists within a platform which causes a host of problems. Nonetheless, with soft SKU'ing, Platform Controller Hub (PCH) Soft Straps are utilized to configure features of a specified platform. The process is more common with PCH dies and less common for individual microprocessors. Nonetheless, soft SKU'ing is not a preferred way to track SKUs because it is not reliable the way that hard SKU'ing is because the configuration or behavior of the CPU processor can be modified subsequent to leaving the control of the manufacturer's facilities or supply chain. For instance, soft SKU'ing is managed in firmware (FW) running on the PCH via Management Engine (ME) firmware.

Such solutions simply lack either the supply chain flexibility or the permanence and reliability needed for CPU processors and other semiconductor products.

Conversely, with late SKU'ing RF NVRAM permalock banks are utilized to store the fuse information and to permanently lock the bank of registers/bits so that no further changes can ever be made to the manufactured CPU processor once SKU'd, thus providing the needed flexibility to SKU as late as possible in the supply chain but at the same time providing the reliability and determinism that Hard SKU'ing provides. Processors which integrate RFID chip into the semiconductor package provide the needed permanently lockable storage space through which the SKU information may be programmed and locked, thus fixing the desired SKU or configuration for any given open SKU CPU processor.

Such RFID chips incorporate NVRAM storage to help identify the part within which they are embedded, with the identification information being accessible from the RFID chip via RFGen2 protocols. Present RFIDGen2 specification allows for permalockable NVRAM storage that results in nonchangeable data to be programmed into the NVRAM. Other usages for such permalockable NVRAM storage in an RFID include the storing of UPC/EPC numbers among other things for product identification purposes.

Figure 2:
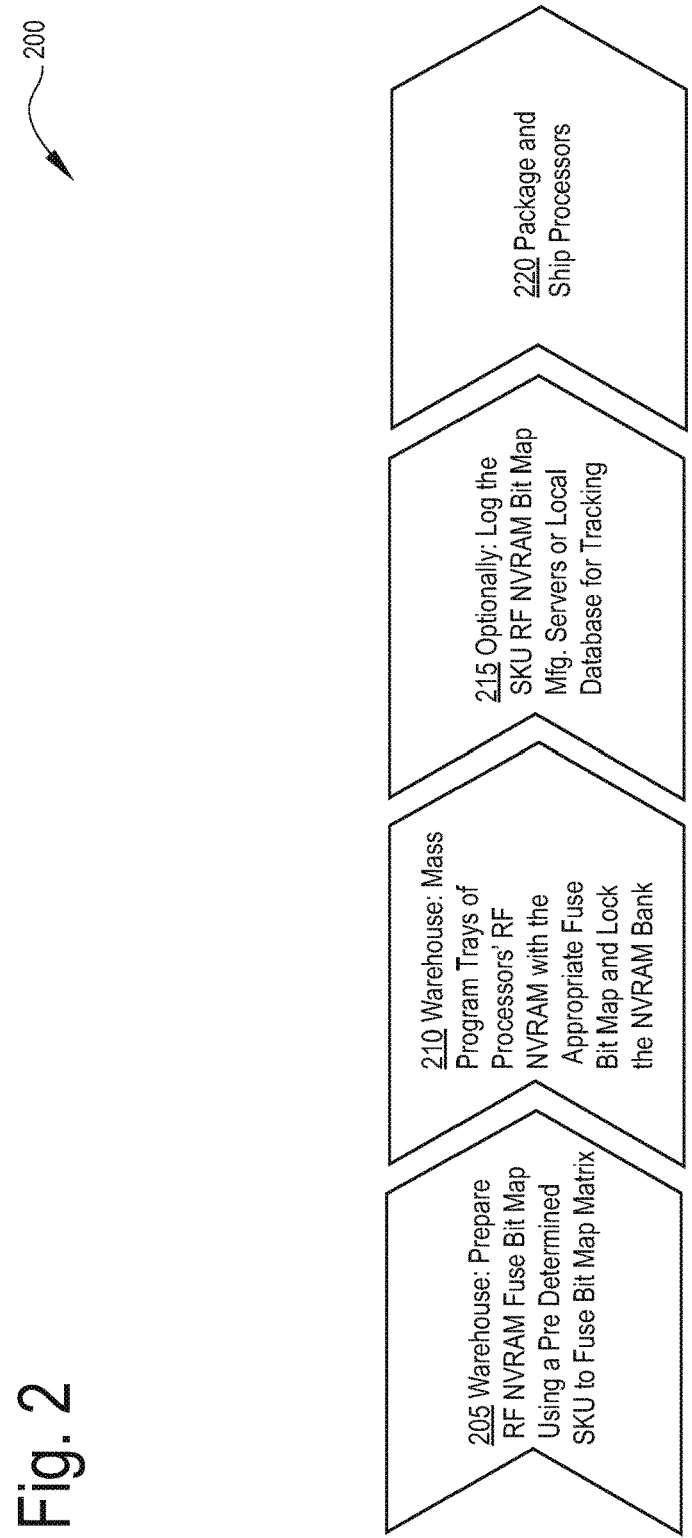
FIG. 2 depicts an exemplary post-manufacturing process flow for warehouse late SKU programming of RF NVRAM in accordance with which embodiments may operate.

FIG. 2 depicts an exemplary post-manufacturing process flow 200 for warehouse late SKU programming of RF NVRAM in accordance with which embodiments may operate.

In particular, it may be observed starting at block 205 from the left, that at the warehouse, there is prepared an RF (Radio Frequency) NVRAM fuse bit map using a predetermined SKU to a fuse bit map matrix.

At block 210, again, at a warehouse or post-manufacture distribution point, processing mass programs trays of processor's RF NVRAMs with the appropriate fuse bit map and additionally lock or permanently lock or permanently fuse the NVRAM fuse bank so as to hard fuse the programmed configuration into each of the tray of CPU processors processed at operation block 210.

At block 215, optional processing may include logging of the SKU RF NVRAM bit map to the manufacturer's servers or a local database for tracking purposes, for instance, to track how many of any given product number or SKU are ultimately created from an available stock of open SKU base CPUs.

At block 220, the warehouse or post-manufacture distribution point having the open SKU base CPUs then packages and ships the processors to the customer, for instance, responsive to a purchase order, etc.

In accordance with particular embodiments, the RFID chip used utilized by the manufacture and integrated or embodied within a manufactured CPU, processor, functional silicon die, etc., includes a subset or a sub-portion of memory which is permanently lockable, such that once written, it cannot ever be changed. According to one embodiment, permalock banks of memory bits are provided by such an RFID chip embodied within a processor or other semiconductor device. According to a particular embodiment, the permalock banks of memory are 128, 256 or 512 bits in size. For instance, one specific product includes fifteen total permanently lockable memory banks within a single RFID chip embedded within the processor and of the fifteen banks, three are 512 bits in size and the remaining twelve are 128 bits in size. Other configurations are contemplated depending on design needs and considerations. Moreover, such an RFID chip may have other memory banks which are securable such that they are password protectable and/or open such that they may be written, read, and re-written to, such as with conventional FLASH solid state memories, albeit embedded within the RFID tag of a microprocessor. For instance, microprocessor architectures may provide banks of permanently lockable memory within the RFID tag capable of being programmed post manufacture by an RFID gun for the purposes of late SKU'ing the processors as described herein.

Once the SKU details are fused, permanently written, or otherwise programmed into the RF NVRAM of the microprocessor, the processors PCU ("Power Control Unit") and pCode implementation internally queries the fuse details via, by way of example, a SMBus connection to the RF NVRAM and take appropriate fuse distribution actions. More generally, on any cold boot, the semiconductor product, be it a CPU processor or otherwise, reads the fuse details from the RF NVRAM fuse registers of the RFID chip embedded within the CPU processor to determine the programmed fuse bits. Once read from the RFID chip, the CPU processor then distributes the read out fuse bits to control registers of the CPU device which determine the operation of the CPU device, for instance, which determine which features of the CPU device are enabled or disabled.

For example, the PCU/pCode implementation of the CPU processor retrieves and distributes the appropriate fuse bits to effectuate the programmed configuration or SKU of the processor. Because this is done at every cold boot, the CPU processor will always operate pursuant to that configuration, after every boot cycle.

In other embodiments, some configuration details are written into the permanently locking memory or storage bits of the RF NVRAM whereas others are hardware fused (e.g., burnt) into fuse registers of the CPU processor. In such a case, the PCU/pCode implementation of the CPU processor retrieves and distributes the appropriate fuse bits and reads out the hardware fused bits into control registers, and the combination of hardware fused bits and RF NVRAM programmed fuse bits thus effectuate the configuration of the CPU processor in accordance with the programmed and hardware fused SKU. According to such an embodiment, the hardware fused registers are burnt into the fuse registers of the CPU processor by the manufacturer at the time of manufacture and the RF NVRAM fuse bits are programmed into the RF NVRAM of the CPU processor at a time other than manufacture by an entity other than the manufacturer of the CPU processor, for instance, at a warehouse or at another post-manufacture distribution point for the CPU processor.

For instance, a consumer may purchase an Intel i7 processor core, however, there may be three distinct SKUs for each of three otherwise same processors other than each running at different frequencies or each having slightly different characteristics.

Each CPU processor die manufactured therefore is produced utilizing a template-based manufacturing process in which the initially produced CPU processor, prior to fuse configuration, can be configured to become any one of the available CPU processor SKUs available. However, due to marketing and customer needs, differing SKU strategies determine which of any number of capabilities are provided for each of a variety of SKUs at the varying price points. Within the silicon die itself are tens of thousands of transistor fuses pitched to one or zero, with each fuse being a one or zero flip-flop. Thus, once "burned" that fuse value is permanently set, and locked in forever. It can never be modified.

Unfortunately, if say 75,000 of a specific SKU CPU processor are produced and the demand is only 25,000, then the remainder SKU CPU processors simply go to waste at a massive expense.

However, if the CPU processor configuration is left open at the time of manufacture and sent to the warehouse or another distribution point, then the 75,000 open SKU CPU processors may still be "late" SKU'd or late configured at the warehouse to become any one of the permissible SKU configurations, thus potentially eliminating massive amounts of waste and eliminating significant supply chain complexity.

In such a way, the non-configured or open SKU CPU processors are akin to blank parts produced by a manufacture without settings and shipped to the warehouse where the warehouse may then configure or provide the settings to set the SKU of each of the blank parts specific for incoming customer orders.

Such a strategy negates the potential for parts overruns at the factory, eliminates waste, and simplifies inventory.

Figure 3:
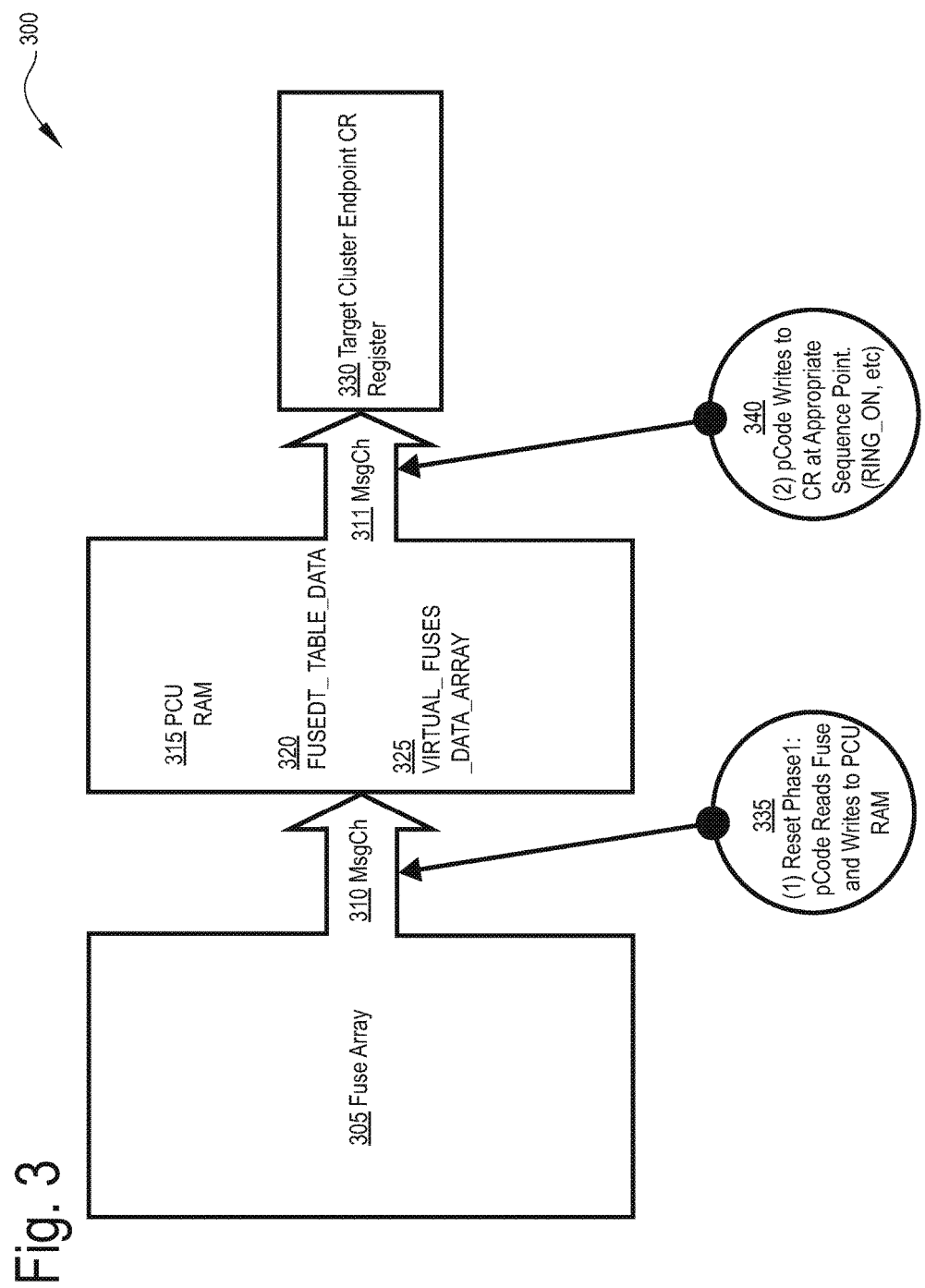
FIG. 3 depicts an exemplary fuse array configuration process flow within a CPU processor for programming of RF NVRAM in accordance with which embodiments may operate.

FIG. 3 depicts an exemplary fuse array configuration process flow within a CPU processor 300 for programming of RF NVRAM in accordance with which embodiments may operate.

In particular, there is depicted a high level fuse distribution scheme by which fuse bits, whether stored in hardware fused (burnt) fuse registers or programmable permanently locking RF NVRAM storage, may be retrieved and distributed into the CPU at boot time.

Depicted on the left is a fuse array 305 which having fuse registers therein which are either hardware fused (burnt) at a time of manufacture or RF NVRAM fuse registers capable of being "late" SKU'd or programmed subsequent to manufacture of the CPU processor. Regardless, at operation 335 it is shown that at a reset phase1, pCode reads the fuse bit registers from the fuse array 305 via message channel 310 and writes them into PCU RAM 315 of the processor. For instance, the bits of the fuse array 305 received via message channel 310 are written into a table held in the PCU RAM, such as the FUSE_TABLE_DATA 320 in the case of hardware fused (e.g., burnt) into fuse registers of the CPU processor or into the VIRTUAL_FUSES_DATA_ARRAY 325 in the case of RF NVRAM fuse bits programmed into the RF RFID of the CPU processor.

Next, the pCode locks the CPU processor's 300 SA unit's Phase Locked Loop (PLL) and asserts a PwrGood signal to the SA units (e.g., the EDC, MC, Mesh, etc.). Next, at reset phase2, the pCode de-asserts reset to the SA units and may additionally program BGFs.

At this stage, the message channel 311 from the PCU RAM 315 to the SA units is now functional. As depicted by operation 340, the pCode writes to the CR (control registers) of the CPU processor 300 at appropriate sequence points, such as RING_ON, etc, thus distributing the fuses to the control registers (CRs) in the SA units as depicted at block 330 with the target cluster endpoint control register receiving the fuse bits via message channel 311. Multiple sequencing points may be supported in accordance with described embodiments, for instance, sequencing points supported may include each of: RING_ON, PHASE1_END, RING_ON_HVM, and RID. According to such embodiments, most of the distributed fuses are in the RING_ON sequence point.

At this stage, the processor is fully configured from cold boot in accordance with one or both of hardware fused (burnt) at a time of manufacture or RF NVRAM fuse registers having been "late" SKU'd or programmed subsequent to manufacture of the CPU processor 300.

Figure 4:
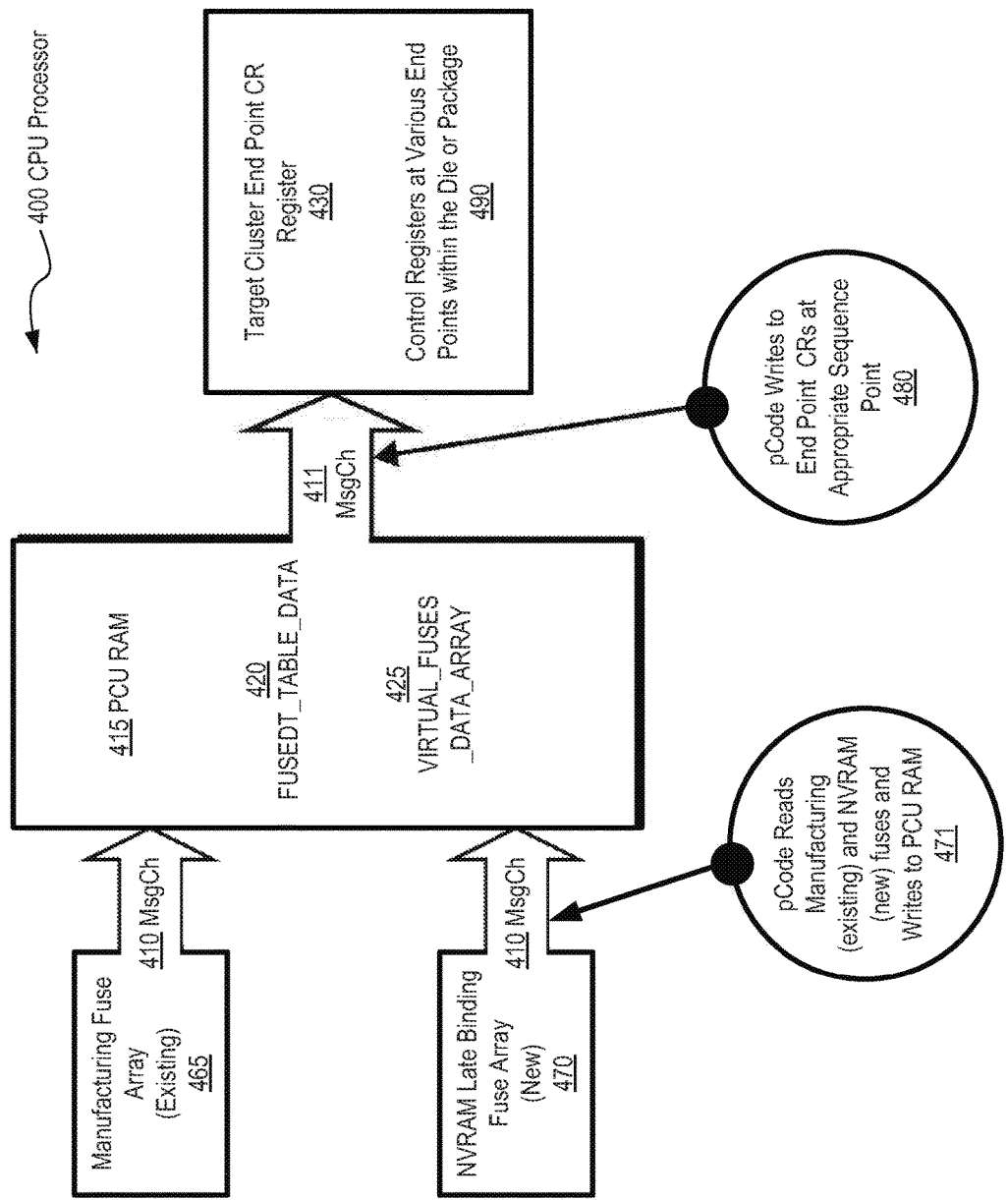
FIG. 4 depicts an exemplary fuse array configuration process for programming a CPU processor via late SKU programming of RF NVRAM in accordance with which embodiments may operate.

FIG. 4 depicts an exemplary fuse array configuration process for programming a CPU processor 400 via late SKU programming of RF NVRAM in accordance with which embodiments may operate.

As depicted here, there are both hardware fused (burnt) and RF NVRAM programmed fused registers. In particular, at block 465 there is depicted a manufacturing fuse array having existing fuse registers which were previously burnt by the manufacturer at the time of manufacture. Conversely, depicted at block 470 are the newly programmed fuse bits within the NVRAM late binding fuse array having been "late" SKU'd or programmed subsequent to manufacture of the CPU processor by, for instance, a warehouse or other distribution point other than the manufacturer of the CPU processor 400.

Regardless, at operation 471 it is shown that pCode reads both the manufacturing fuse array 465 and also reads the NVRAM late binding fuse array 470 via message channels 410 and writes the values into the PCU RAM 415 of the processor. For instance, the bits of the fuse array 405 received via message channel 410 are written into a table held in the PCU RAM, such as the FUSE_TABLE_DATA 420 in the case of hardware fused (e.g., burnt) into fuse registers of the CPU processor or into the VIRTUAL_FUSES_DATA_ARRAY 425 in the case of RF NVRAM fuse bits programmed into the RF RFID of the CPU processor.

Next, the pCode locks the CPU processor's 400 SA unit's Phase Locked Loop (PLL) and asserts a PwrGood signal to the SA units (e.g., the EDC, MC, Mesh, etc.). Next, at reset phase2, the pCode de-asserts reset to the SA units and may additionally program BGFs.

At this stage, the message channel 411 from the PCU RAM 415 to the SA units is now functional. As depicted by operation 480, the pCode writes to the end point CR (control registers) of the CPU processor 400 at appropriate sequence points, such as RING_ON, etc, thus distributing the fuses to the control registers (CRs) in the SA units as depicted at block 430 with the target cluster endpoint control register receiving the fuse bits via message channel 411 thus configuring or programming control registers at various end points within the CPU processor 400 die or semiconductor package (element 490). As before, multiple sequencing points may be supported in accordance with described embodiments, for instance, sequencing points supported may include each of: RING_ON, PHASE1_END, RING_ON_HVM, and RID. According to such embodiments, most of the distributed fuses are in the RING_ON sequence point.

At this stage, the processor is fully configured from cold boot in accordance with both hardware fused (burnt) bits from the manufacturing fuse array 465 burnt at a time of manufacture and also bits from the NVRAM late binding fuse array 470 registers having been "late" SKU'd or programmed subsequent to manufacture of the CPU processor 400.

Figure 5:
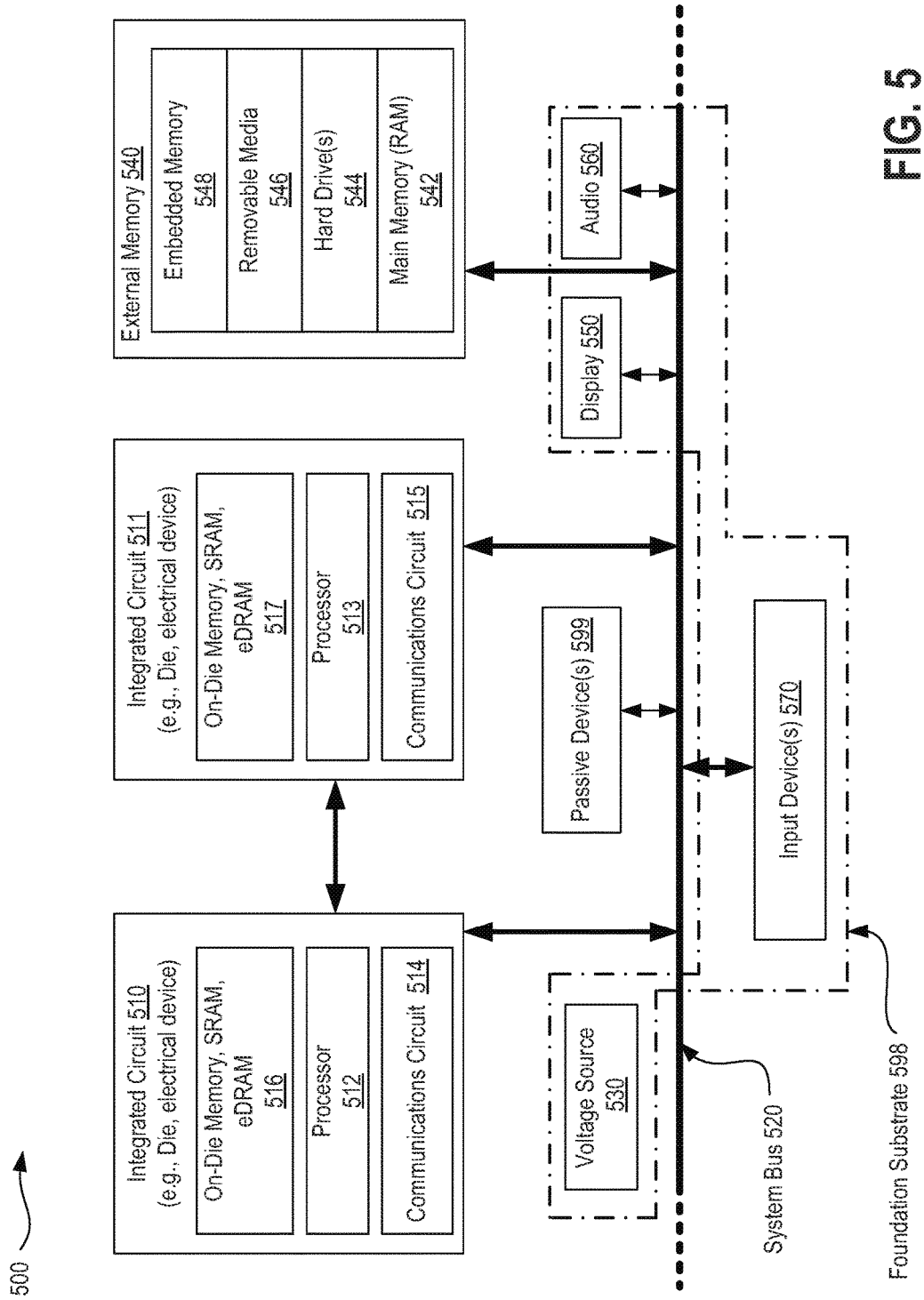
FIG. 5 is a schematic of a computer system in accordance with described embodiments.

FIG. 5 is a schematic of a computer system 500 in accordance with described embodiments. The computer system 500 (also referred to as the electronic system 500) as depicted can embody means for implementing late fusing of processor features using a non-volatile memory, according to any of the several disclosed embodiments and their equivalents as set forth in this disclosure. The computer system 500 may be a mobile device such as a net-book computer. The computer system 500 may be a mobile device such as a wireless smart phone or tablet. The computer system 500 may be a desktop computer. The computer system 500 may be a hand-held reader. The computer system 500 may be a server system. The computer system 500 may be a supercomputer or high-performance computing system.

In accordance with one embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

Such an integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, electrical devices having gradient encapsulant protection, as disclosed herein.

In accordance with one embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In accordance with one embodiment, the integrated circuit 510 is complemented with a subsequent integrated circuit 511. Useful embodiments include a dual processor 513 and a dual communications circuit 515 and dual on-die memory 517 such as SRAM. In accordance with one embodiment, the dual integrated circuit 510 includes embedded on-die memory 517 such as eDRAM.

In one embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In accordance with one embodiment, the electronic system 500 also includes a display device 550 and an audio output 560. In one embodiment, the electronic system 500 includes an input device 570 such as a controller that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including means for implementing late fusing of processor features using a non-volatile memory, according to any of the several disclosed embodiments and their equivalents, an electronic system, a computer system, one or more methods of fabricating an integrated circuit, and one or more methods of fabricating an electronic assembly that includes means for implementing late fusing of processor features using a non-volatile memory, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and means for implementing late fusing of processor features using a non-volatile memory embodiments and their equivalents. A foundation substrate 598 may be included, as represented by the dashed line of FIG. 5. Passive devices 599 may also be included, as is also depicted in FIG. 5.

Figure 6:
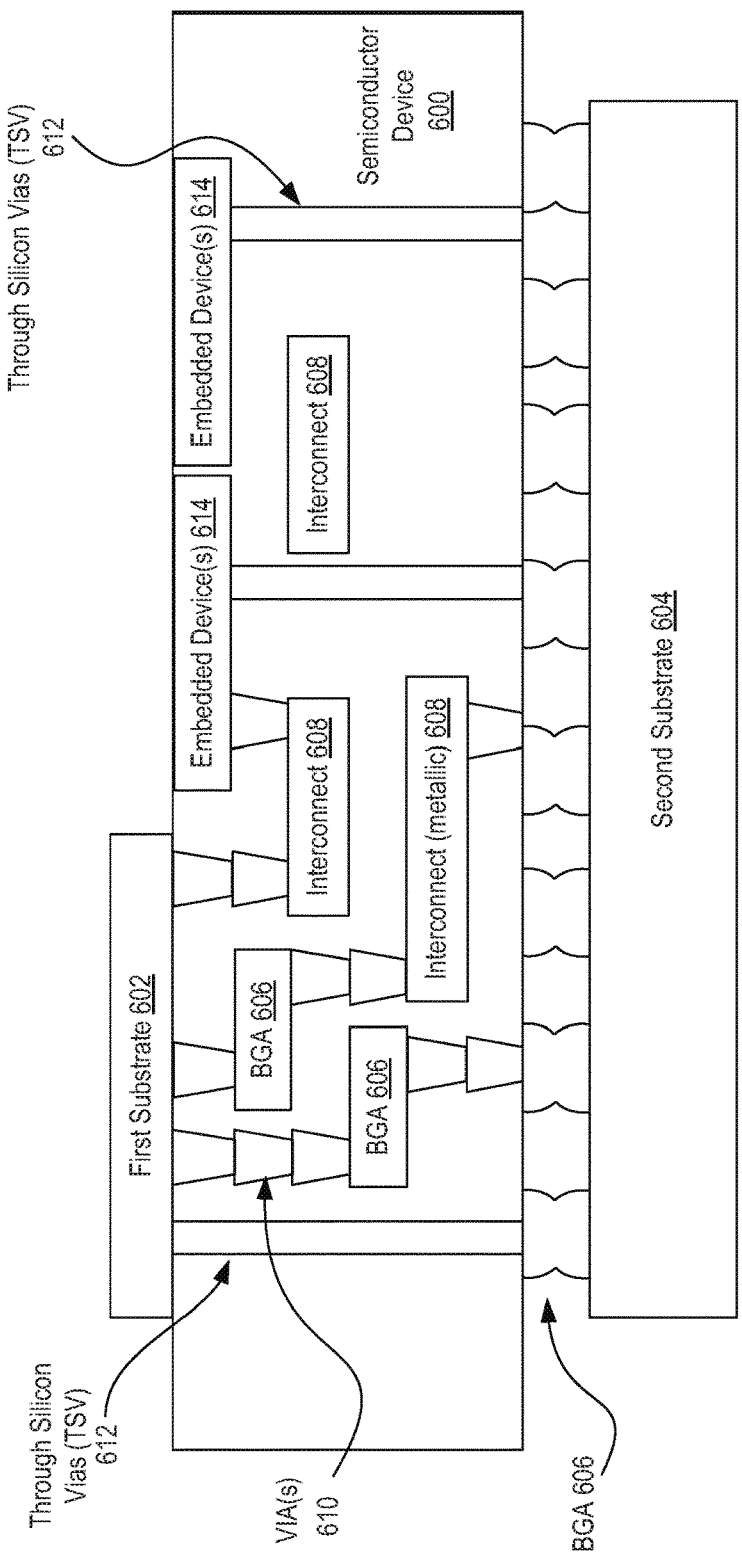
FIG. 6 illustrates an interposer that includes one or more described embodiments.

FIG. 6 illustrates a semiconductor device 600 (e.g., an interposer) that includes one or more described embodiments. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with described embodiments, apparatuses or processes disclosed herein may be used in the fabrication of interposer 600.

Figure 7:
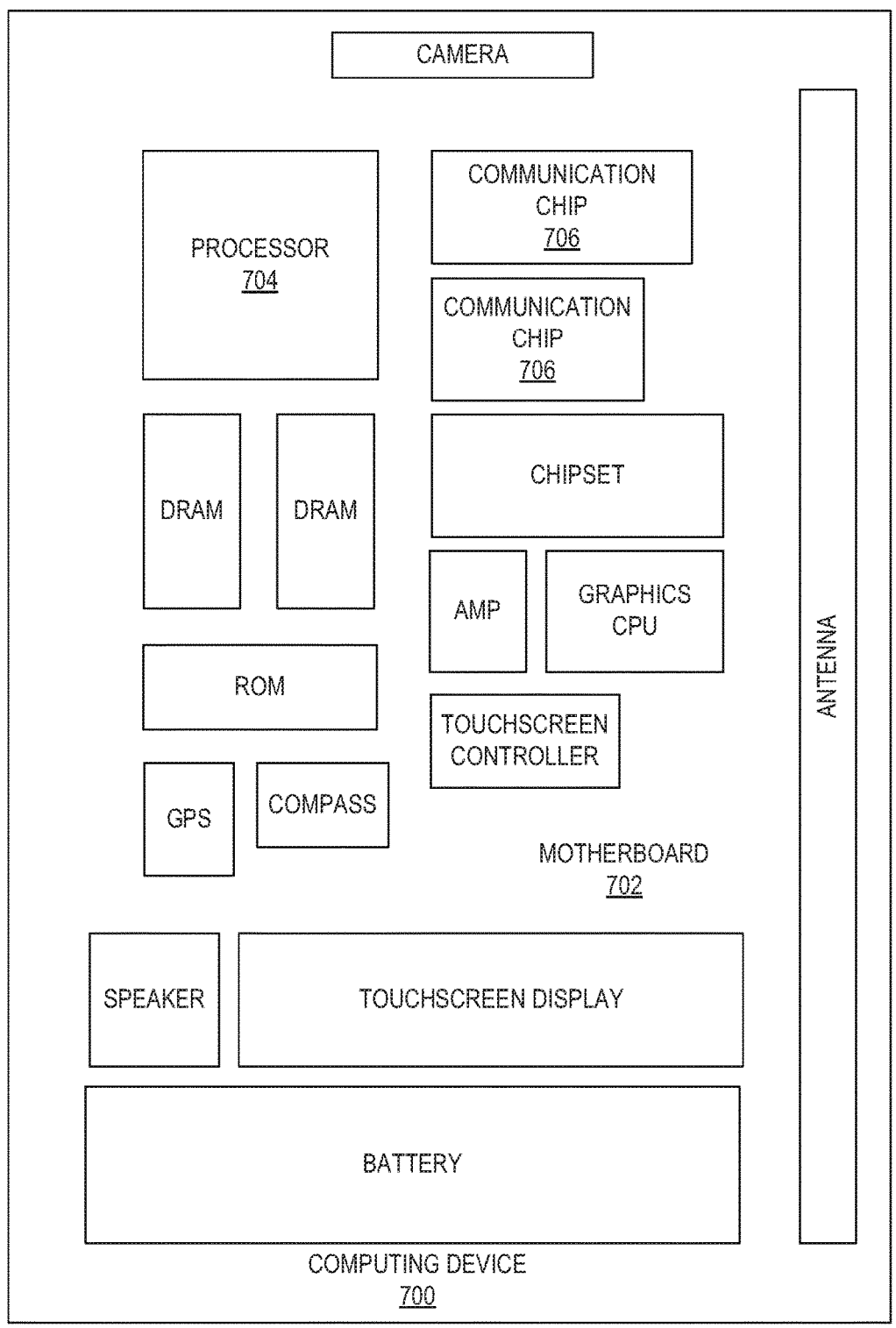
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
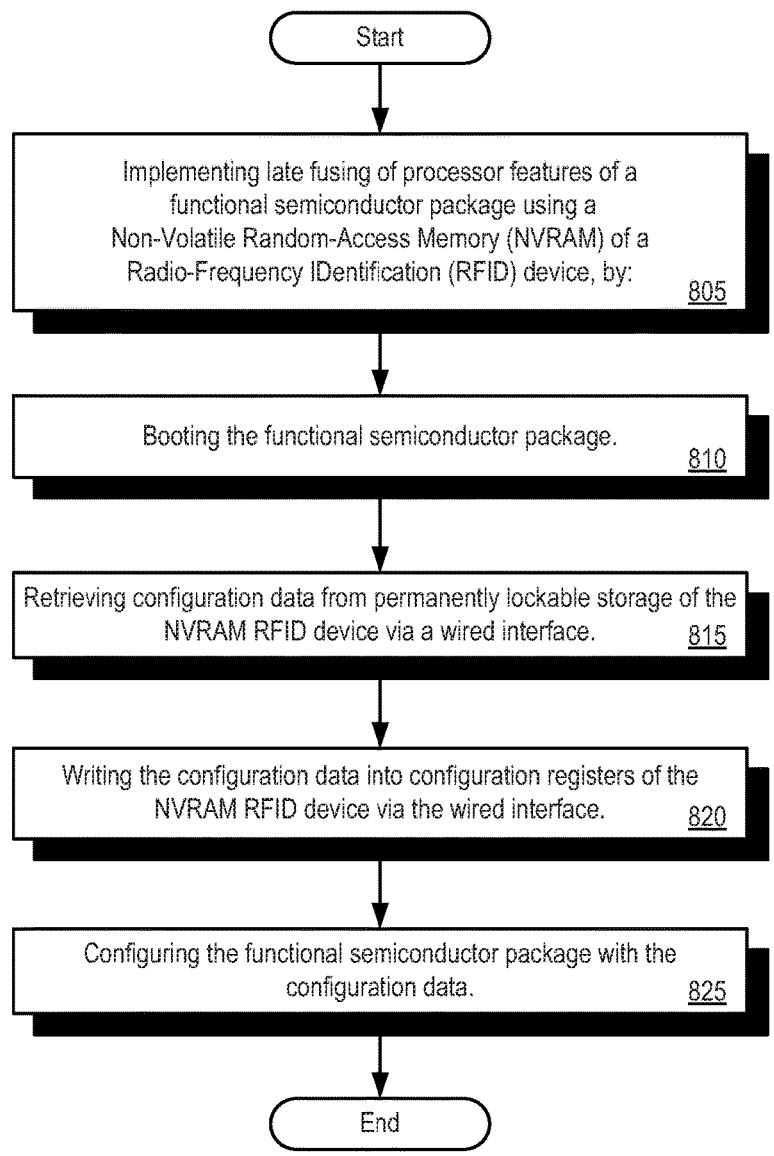
FIG. 8 is a flow diagram illustrating a method for implementing late fusing of processor features using a non-volatile memory in accordance with described embodiments.

FIG. 8 is a flow diagram illustrating a method 800 for implementing late fusing of processor features using a non-volatile memory in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from method 800 may be utilized in a variety of combinations.

At block 805 the method 800 begins with implementing late fusing of processor features of a functional semiconductor package using a Non-Volatile Random-Access Memory (NVRAM) of a Radio-Frequency IDentification (RFID) device, by the following operations:

At block 810 the method includes booting the functional semiconductor package.

At block 815 the method includes retrieving configuration data from permanently lockable storage of the NVRAM RFID device via a wired interface.

At block 820 the method includes writing the configuration data into configuration registers of the NVRAM RFID device via the wired interface.

At block 825 the method includes configuring the functional semiconductor package with the configuration data.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is a functional semiconductor package, including: a processor core configurable via a plurality of configuration registers; a non-volatile storage, in which a first portion of the non-volatile storage includes permanently lockable storage that once written cannot be overwritten or modified, and in which a second portion of the non-volatile storage includes the plurality of configuration registers; a first write interface to the non-volatile storage, in which the permanently lockable storage of the non-volatile storage is wirelessly writable externally from the functional semiconductor package via the first write interface; a second write interface to the non-volatile storage through which the plurality of configuration registers are writable; configuration data for the processor core written wirelessly into the permanently lockable storage of the non-volatile storage; and in which the configuration data is distributed into the plurality of configuration registers via the second write interface at every boot of the functional semiconductor package.

According to another embodiment of the functional semiconductor package, the non-volatile storage includes a Radio-Frequency IDentification (RFID) device embedded within the functional semiconductor package and wirelessly writable from external the functional semiconductor package.

According to another embodiment of the functional semiconductor package, the RFID device is wirelessly writable via a second generation (gen2) protocol compliant RFID gun.

According to another embodiment of the functional semiconductor package, the non-volatile storage includes Non-Volatile Random-Access Memory (NVRAM) of a Radio-Frequency IDentification (RFID) device embedded within the functional semiconductor package.

According to another embodiment of the functional semiconductor package, the permanently lockable storage of the non-volatile storage that once written cannot be overwritten or modified includes permalock storage of the NVRAM RFID device embedded within the functional semiconductor package.

According to another embodiment, the functional semiconductor package further includes: a wired interface to the NVRAM RFID device; in which the second write interface to the non-volatile storage through which the plurality of configuration registers are writable includes the configuration registers of the non-volatile storage being writeable via the wired interface; and in which the configuration data distributed into the plurality of configuration registers via the second write interface at every boot of the functional semiconductor package includes the configuration data being retrieved from the permanently lockable storage of the NVRAM RFID device via the wired interface and written into the configuration registers of the NVRAM RFID device via the wired interface.

According to another embodiment of the functional semiconductor package, the second write interface to the non-volatile storage includes a wired interface to the NVRAM RFID device; and in which the configuration data is retrieved from the permanently lockable storage of the NVRAM RFID device via the wired interface and written into the configuration registers of the NVRAM RFID device via the wired interface without powering up the NVRAM RFID device within the functional semiconductor package.

According to another embodiment of the functional semiconductor package, the configuration data for the processor core having been written wirelessly into the permanently lockable storage of the NVRAM RFID device includes the configuration data being written into the permanently lockable storage of the NVRAM RFID device by powering up the NVRAM RFID device energized via a second generation (gen2) protocol compliant RFID gun and without booting the functional semiconductor package.

According to another embodiment of the functional semiconductor package, the functional semiconductor package is to consume the configuration data written into the configuration registers of the NVRAM RFID device at every boot of the functional semiconductor package; in which the configuration data consumed by the functional semiconductor package at boot enables a configuration for the functional semiconductor package corresponding to a specific Stock Keeping Unit (SKU) as controlled by the configuration data.

According to another embodiment of the functional semiconductor package, the configuration data for the processor core written wirelessly into the permanently lockable storage of the non-volatile storage includes a configuration for the functional semiconductor package corresponding to a specific Stock Keeping Unit (SKU) written to the functional semiconductor package at a time subsequent to manufacture of the functional semiconductor package at a location other than a place of manufacture of the functional semiconductor package.

According to another embodiment of the functional semiconductor package, the configuration data for the processor core is written wirelessly into the permanently lockable storage of the non-volatile storage at a warehouse or a distribution point for the functional semiconductor package other than the place of manufacture of the functional semiconductor package.

According to another embodiment, the functional semiconductor package further includes: a Power Control Unit (PCU); and in which the configuration data distributed into the plurality of configuration registers via the second write interface at every boot of the functional semiconductor package includes code of the PCU to query the non-volatile storage through the second write interface to retrieve the configuration data from the permanently lockable storage of the non-volatile storage and in which the code of the PCU is to distribute the configuration data to the configuration registers where it is consumed by the functional semiconductor package as part of a boot process for the functional semiconductor package.

According to another embodiment, the functional semiconductor package further includes: a Power Control Unit (PCU); a manufacturing fuse array having fuse registers burnt at a time of manufacture; an NVRAM late binding fuse array having the configuration information stored therein and having been programmed into the permanently lockable storage of the non-volatile storage subsequent to manufacture of the functional semiconductor package by a warehouse or other distribution point other than a manufacturer of the functional semiconductor package; and in which the configuration data distributed into the plurality of configuration registers via the second write interface at every boot of the functional semiconductor package includes code of the PCU to query the non-volatile storage through the second write interface to retrieve both the manufacturing fuse array and the NVRAM late binding fuse array having the configuration information stored therein and in which the code of the PCU is to distribute the manufacturing fuse array and the NVRAM late binding fuse array having the configuration information to the configuration registers where it is consumed by the functional semiconductor package as part of a boot process for the functional semiconductor package.

According to another embodiment the functional semiconductor package embodies one of: a processor core silicon die; a CPU processor package; a Platform Controller Hub (PCH); a System On a Chip (SOC) functional silicon die; a logic functional silicon die; and a three-dimensional (3D) stacked substrate package having at least a processor core functional silicon die and one or more memory functional silicon dies embedded therein.

According to another embodiment there is a method for implementing late fusing of processor features of a functional semiconductor package using a Non-Volatile Random-Access Memory (NVRAM) of a Radio-Frequency IDentification (RFID) device, in which the method includes: booting the functional semiconductor package, in which the functional semiconductor package includes: (i) a processor core configurable via a plurality of configuration registers; (ii) a non-volatile storage within the NVRAM RFID device, in which a first portion of the non-volatile storage includes permanently lockable storage that once written cannot be overwritten or modified, and in which a second portion of the NVRAM RFID device includes the plurality of configuration registers; (iii) a first write interface to the non-volatile storage, in which the permanently lockable storage of the non-volatile storage is wirelessly writable externally from the functional semiconductor package via the first write interface; (iv) a wired interface to the non-volatile storage through which the plurality of configuration registers are writable; (v) configuration data for the processor core written wirelessly into the permanently lockable storage of the non-volatile storage; retrieving the configuration data from the permanently lockable storage of the NVRAM RFID device via the wired interface; writing the configuration data into the configuration registers of the NVRAM RFID device via the wired interface; and configuring the functional semiconductor package with the configuration data.

According to another embodiment the method further includes: wirelessly receiving the configuration data from a second generation (gen2) protocol compliant RFID gun, in which the RFID gun energizes the NVRAM RFID device powering up the NVRAM RFID device within the functional semiconductor package without booting the functional semiconductor package; and in which booting the functional semiconductor package includes booting subsequent to wirelessly receiving the configuration data and subsequent to powering down the NVRAM RFID device.

According to another embodiment of the method, the functional semiconductor package is to consume the configuration data written into the configuration registers of the NVRAM RFID device at every boot of the functional semiconductor package; in which configuring the functional semiconductor package with the configuration data at boot enables a configuration for the functional semiconductor package corresponding to a specific Stock Keeping Unit (SKU) as controlled by the configuration data.

According to another embodiment of the method, the configuration data for the processor core written wirelessly into the permanently lockable storage of the NVRAM RFID device includes a configuration for the functional semiconductor package corresponding to a specific Stock Keeping Unit (SKU) written to the functional semiconductor package at a time subsequent to manufacture of the functional semiconductor package at a location other than a place of manufacture of the functional semiconductor package.

According to another embodiment of the method, the configuration data for the processor core is written wirelessly into the permanently lockable storage of the NVRAM RFID device at a warehouse or a distribution point for the functional semiconductor package other than the place of manufacture of the functional semiconductor package.

According to another embodiment of the method, the functional semiconductor package further includes a Power Control Unit (PCU); and in which configuring the functional semiconductor package with the configuration data at boot includes code of the PCU querying the NVRAM RFID device through the wired interface and retrieving the configuration data from the permanently lockable storage of the NVRAM RFID device; and distributing, via the code of the PCU, the configuration data to the configuration registers where it is consumed by the functional semiconductor package as part of a boot process for the functional semiconductor package.

According to another embodiment of the method, the functional semiconductor package further includes: a Power Control Unit (PCU); and a manufacturing fuse array having fuse registers burnt at a time of manufacture; an NVRAM late binding fuse array having the configuration information stored therein and having been programmed into the permanently lockable storage of the non-volatile storage subsequent to manufacture of the functional semiconductor package by a warehouse or other distribution point other than a manufacturer of the functional semiconductor package; and in which configuring the functional semiconductor package with the configuration data at boot includes code of the PCU to querying the NVRAM RFID device through the wired interface and retrieving both the manufacturing fuse array and the NVRAM late binding fuse array having the configuration information stored therein and distributing, via the code of the PCU, the manufacturing fuse array and the NVRAM late binding fuse array having the configuration information to the configuration registers for consumption by the functional semiconductor package as part of the boot process for the functional semiconductor package.

According to another embodiment of the method, the functional semiconductor package embodies one of: a processor core silicon die; a CPU processor package; a Platform Controller Hub (PCH); a System On a Chip (SOC) functional silicon die; a logic functional silicon die; and a three-dimensional (3D) stacked substrate package having at least a processor core functional silicon die and one or more memory functional silicon dies embedded therein.

According to another embodiment, there is an electronics module including: a printed circuit board; a functional semiconductor package electrically interfaced to the printed circuit board; and in which the functional semiconductor package includes: (i) a substrate layer (ii) a processor core configurable via a plurality of configuration registers; (iii) a non-volatile storage, in which a first portion of the non-volatile storage includes permanently lockable storage that once written cannot be overwritten or modified, and in which a second portion of the non-volatile storage includes the plurality of configuration registers; (iv) a first write interface to the non-volatile storage, in which the permanently lockable storage of the non-volatile storage is wirelessly writable externally from the functional semiconductor package via the first write interface; (v) a second write interface to the non-volatile storage through which the plurality of configuration registers are writable; and (vi) configuration data for the processor core written wirelessly into the permanently lockable storage of the non-volatile storage, in which the configuration data is distributed into the plurality of configuration registers via the second write interface at every boot of the functional semiconductor package.

According to another embodiment, the electronics module includes one of: a drone and robot control electronics module; a smartphone electronics module; a tablet electronics module; a gesture control electronics module for a computer; a 3D photography electronics module; a 3D immersive gaming electronics module; a face recognition electronics module to perform face recognition base security in lieu of alphanumerical passwords; an image capture device electronics module having one or more optical and Complementary metal-oxide-semiconductor (CMOS) components affixed to the printed circuit board as the top side or bottom side components; a depth sensing camera electronics module to perform any of stereoscopic imaging depth sensing, coded light depth sensing, or laser time of flight depth sensing.

According to another embodiment, the electronics module is embedded within a wearable technology to be worn as one of: a clothing item; sports attire; a shoe; fashion electronics to be worn as a clothing item or an accessory; tech togs to be worn as a clothing item or an accessory; or fashionable technology to be worn as a clothing item or an accessory.

What is claimed is:

1. A functional semiconductor package, comprising:
   a processor core configurable via a plurality of configuration registers;
   a non-volatile storage, wherein a first portion of the non-volatile storage comprises permanently lockable storage that once written cannot be overwritten or modified, and wherein a second portion of the non-volatile storage comprises the plurality of configuration registers;
   a first write interface to the non-volatile storage, wherein the permanently lockable storage of the non-volatile storage is wirelessly writable externally from the functional semiconductor package via the first write interface;
   a second write interface to the non-volatile storage through which the plurality of configuration registers are writable;
   configuration data for the processor core written wirelessly into the permanently lockable storage of the non-volatile storage; and
   wherein the configuration data is distributed into the plurality of configuration registers via the second write interface at every boot of the functional semiconductor package.

2. The functional semiconductor package of claim 1, wherein the non-volatile storage comprises a Radio-Frequency IDentification (RFID) device embedded within the functional semiconductor package and wirelessly writable from external the functional semiconductor package.

3. The functional semiconductor package of claim 2, wherein the RFID device is wirelessly writable via a second generation (gen2) protocol compliant RFID gun.

4. The functional semiconductor package of claim 1:
   wherein the non-volatile storage comprises Non-Volatile Random-Access Memory (NVRAM) of a Radio-Frequency IDentification (RFID) device embedded within the functional semiconductor package.

5. The functional semiconductor package of claim 4:
   wherein the permanently lockable storage of the non-volatile storage that once written cannot be overwritten or modified comprises permalock storage of the NVRAM RFID device embedded within the functional semiconductor package.

6. The functional semiconductor package of claim 5, further comprising:
   a wired interface to the NVRAM RFID device;
   wherein the second write interface to the non-volatile storage through which the plurality of configuration registers are writable comprises the configuration registers of the non-volatile storage being writeable via the wired interface; and wherein the configuration data distributed into the plurality of configuration registers via the second write interface at every boot of the functional semiconductor package comprises the configuration data being retrieved from the permanently lockable storage of the NVRAM RFID device via the wired interface and written into the configuration registers of the NVRAM RFID device via the wired interface.

7. The functional semiconductor package of claim 4:

wherein the second write interface to the non-volatile storage comprises a wired interface to the NVRAM RFID device; and wherein the configuration data is retrieved from the permanently lockable storage of the NVRAM RFID device via the wired interface and written into the configuration registers of the NVRAM RFID device via the wired interface without powering up the NVRAM RFID device within the functional semiconductor package.

8. The functional semiconductor package of claim 4:

wherein the configuration data for the processor core having been written wirelessly into the permanently lockable storage of the NVRAM RFID device comprises the configuration data being written into the permanently lockable storage of the NVRAM RFID device by powering up the NVRAM RFID device energized via a second generation (gen2) protocol compliant RFID gun and without booting the functional semiconductor package.

9. The functional semiconductor package of claim 4:

wherein the functional semiconductor package is to consume the configuration data written into the configuration registers of the NVRAM RFID device at every boot of the functional semiconductor package;

wherein the configuration data consumed by the functional semiconductor package at boot enables a configuration for the functional semiconductor package corresponding to a specific Stock Keeping Unit (SKU) as controlled by the configuration data.

10. The functional semiconductor package of claim 1, wherein the configuration data for the processor core written wirelessly into the permanently lockable storage of the non-volatile storage comprises a configuration for the functional semiconductor package corresponding to a specific Stock Keeping Unit (SKU) written to the functional semiconductor package at a time subsequent to manufacture of the functional semiconductor package at a location other than a place of manufacture of the functional semiconductor package.

11. The functional semiconductor package of claim 10, wherein the configuration data for the processor core is written wirelessly into the permanently lockable storage of the non-volatile storage at a warehouse or a distribution point for the functional semiconductor package other than the place of manufacture of the functional semiconductor package.

12. The functional semiconductor package of claim 1, further comprising:

a Power Control Unit (PCU); and wherein the configuration data distributed into the plurality of configuration registers via the second write interface at every boot of the functional semiconductor package comprises code of the PCU to query the non-volatile storage through the second write interface to retrieve the configuration data from the permanently lockable storage of the non-volatile storage and wherein the code of the PCU is to distribute the configuration data to the configuration registers where it is consumed by the functional semiconductor package as part of a boot process for the functional semiconductor package.

13. The functional semiconductor package of claim 1, further comprising:

a Power Control Unit (PCU);

a manufacturing fuse array having fuse registers burnt at a time of manufacture;

an NVRAM late binding fuse array having the configuration information stored therein and having been programmed into the permanently lockable storage of the non-volatile storage subsequent to manufacture of the functional semiconductor package by a warehouse or other distribution point other than a manufacturer of the functional semiconductor package; and wherein the configuration data distributed into the plurality of configuration registers via the second write interface at every boot of the functional semiconductor package comprises code of the PCU to query the non-volatile storage through the second write interface to retrieve both the manufacturing fuse array and the NVRAM late binding fuse array having the configuration information stored therein and wherein the code of the PCU is to distribute the manufacturing fuse array and the NVRAM late binding fuse array having the configuration information to the configuration registers where it is consumed by the functional semiconductor package as part of a boot process for the functional semiconductor package.

14. The functional semiconductor package of claim 1, wherein the functional semiconductor package embodies one of:

a processor core silicon die;

a CPU processor package;

a Platform Controller Hub (PCH);

a System On a Chip (SOC) functional silicon die;

a logic functional silicon die; and a three-dimensional (3D) stacked substrate package having at least a processor core functional silicon die and one or more memory functional silicon dies embedded therein.

15. A method for implementing late fusing of processor features of a functional semiconductor package using a Non-Volatile Random-Access Memory (NVRAM) of a Radio-Frequency IDentification (RFID) device, wherein the method comprises:

booting the functional semiconductor package, wherein the functional semiconductor package comprises:

(i) a processor core configurable via a plurality of configuration registers;

(ii) a non-volatile storage within the NVRAM RFID device, wherein a first portion of the non-volatile storage comprises permanently lockable storage that once written cannot be overwritten or modified, and wherein a second portion of the NVRAM RFID device comprises the plurality of configuration registers;

(iii) a first write interface to the non-volatile storage, wherein the permanently lockable storage of the non-volatile storage is wirelessly writable externally from the functional semiconductor package via the first write interface;

(iv) a wired interface to the non-volatile storage through which the plurality of configuration registers are writable;
(v) configuration data for the processor core written wirelessly into the permanently lockable storage of the non-volatile storage;
retrieving the configuration data from the permanently lockable storage of the NVRAM RFID device via the wired interface;
writing the configuration data into the configuration registers of the NVRAM RFID device via the wired interface; and
configuring the functional semiconductor package with the configuration data.

16. The method of claim 15, further comprising:
wirelessly receiving the configuration data from a second generation (gen2) protocol compliant RFID gun, wherein the RFID gun energizes the NVRAM RFID device powering up the NVRAM RFID device within the functional semiconductor package without booting the functional semiconductor package; and
wherein booting the functional semiconductor package comprises booting subsequent to wirelessly receiving the configuration data and subsequent to powering down the NVRAM RFID device.

17. The method of claim 15:
wherein the functional semiconductor package is to consume the configuration data written into the configuration registers of the NVRAM RFID device at every boot of the functional semiconductor package;
wherein configuring the functional semiconductor package with the configuration data at boot enables a configuration for the functional semiconductor package corresponding to a specific Stock Keeping Unit (SKU) as controlled by the configuration data.

18. The method of claim 15, wherein the configuration data for the processor core written wirelessly into the permanently lockable storage of the NVRAM RFID device comprises a configuration for the functional semiconductor package corresponding to a specific Stock Keeping Unit (SKU) written to the functional semiconductor package at a time subsequent to manufacture of the functional semiconductor package at a location other than a place of manufacture of the functional semiconductor package.

19. The method of claim 15, wherein the configuration data for the processor core is written wirelessly into the permanently lockable storage of the NVRAM RFID device at a warehouse or a distribution point for the functional semiconductor package other than the place of manufacture of the functional semiconductor package.

20. The method of claim 15:
wherein the functional semiconductor package further includes a Power Control Unit (PCU); and
wherein configuring the functional semiconductor package with the configuration data at boot comprises code of the PCU querying the NVRAM RFID device through the wired interface and retrieving the configuration data from the permanently lockable storage of the NVRAM RFID device; and
distributing, via the code of the PCU, the configuration data to the configuration registers where it is consumed by the functional semiconductor package as part of a boot process for the functional semiconductor package.

21. The method of claim 15, wherein the functional semiconductor package further includes:
a Power Control Unit (PCU); and
a manufacturing fuse array having fuse registers burnt at a time of manufacture;
an NVRAM late binding fuse array having the configuration information stored therein and having been programmed into the permanently lockable storage of the non-volatile storage subsequent to manufacture of the functional semiconductor package by a warehouse or other distribution point other than a manufacturer of the functional semiconductor package; and
wherein configuring the functional semiconductor package with the configuration data at boot comprises code of the PCU to querying the NVRAM RFID device through the wired interface and retrieving both the manufacturing fuse array and the NVRAM late binding fuse array having the configuration information stored therein and distributing, via the code of the PCU, the manufacturing fuse array and the NVRAM late binding fuse array having the configuration information to the configuration registers for consumption by the functional semiconductor package as part of the boot process for the functional semiconductor package.

22. The method of claim 15, wherein the functional semiconductor package embodies one of:
a processor core silicon die;
a CPU processor package;
a Platform Controller Hub (PCH);
a System On a Chip (SOC) functional silicon die;
a logic functional silicon die; and
a three-dimensional (3D) stacked substrate package having at least a processor core functional silicon die and one or more memory functional silicon dies embedded therein.

23. An electronics module comprising:
a printed circuit board;
a functional semiconductor package electrically interfaced to the printed circuit board; and
wherein the functional semiconductor package comprises:
(i) a substrate layer
(ii) a processor core configurable via a plurality of configuration registers;
(iii) a non-volatile storage, wherein a first portion of the non-volatile storage comprises permanently lockable storage that once written cannot be overwritten or modified, and wherein a second portion of the non-volatile storage comprises the plurality of configuration registers;
(iv) a first write interface to the non-volatile storage, wherein the permanently lockable storage of the non-volatile storage is wirelessly writable externally from the functional semiconductor package via the first write interface;
(v) a second write interface to the non-volatile storage through which the plurality of configuration registers are writable; and
(vi) configuration data for the processor core written wirelessly into the permanently lockable storage of the non-volatile storage, wherein the configuration data is distributed into the plurality of configuration registers via the second write interface at every boot of the functional semiconductor package.

24. The electronics module of claim 23, wherein the electronics module comprises one of:
a drone and robot control electronics module;
a smartphone electronics module;
a tablet electronics module;
a gesture control electronics module for a computer;
a 3D photography electronics module;

a 3D immersive gaming electronics module;

a face recognition electronics module to perform face recognition base security in lieu of alphanumerical passwords;

an image capture device electronics module having one or more optical and Complementary metal-oxide-semiconductor (CMOS) components affixed to the printed circuit board as the top side or bottom side components;

a depth sensing camera electronics module to perform any of stereoscopic imaging depth sensing, coded light depth sensing, or laser time of flight depth sensing.

25. The electronics module of claim 23, wherein the electronics module is embedded within a wearable technology to be worn as one of:

a clothing item;

sports attire;

a shoe;

fashion electronics to be worn as a clothing item or an accessory;

tech togs to be worn as a clothing item or an accessory; or fashionable technology to be worn as a clothing item or an accessory.

* * * * *